(12) United States Patent
Shukh

(10) Patent No.: US 9,530,822 B2
(45) Date of Patent: Dec. 27, 2016

(54) HIGH DENSITY NONVOLATILE MEMORY

(71) Applicant: Alexander Mikhailovich Shukh, San Jose, CA (US)

(72) Inventor: Alexander Mikhailovich Shukh, San Jose, CA (US)

( * ) Notice: Subject to any disclaimer, the term of this patent is extended or adjusted under 35 U.S.C. 154(b) by 82 days.

(21) Appl. No.: 14/264,014

(22) Filed: Apr. 28, 2014

(65) Prior Publication Data

US 2014/0319634 A1    Oct. 30, 2014

Related U.S. Application Data

(60) Provisional application No. 61/816,803, filed on Apr. 28, 2013.

(51) Int. Cl.
*H01L 27/22* (2006.01)
*H01L 43/08* (2006.01)
*G11C 11/16* (2006.01)
*H01L 43/12* (2006.01)

(52) U.S. Cl.
CPC ............. *H01L 27/224* (2013.01); *H01L 43/08* (2013.01); *G11C 11/16* (2013.01); *G11C 2213/71* (2013.01); *H01L 43/12* (2013.01)

(58) Field of Classification Search
CPC ... B60L 11/1838; B60L 11/1818; Y02T 90/14; Y02T 10/7005; Y02E 60/12; G01R 31/3648; H01L 27/224; H01L 43/08; H01L 43/12; G11C 2213/71; G11C 11/16

See application file for complete search history.

(56) References Cited

U.S. PATENT DOCUMENTS

| | | | | |
|---|---|---|---|---|
| 5,640,343 | A * | 6/1997 | Gallagher | B82Y 10/00 257/E21.665 |
| 6,689,622 | B1 * | 2/2004 | Drewes | G11C 11/16 257/E27.005 |
| 6,798,685 | B2 | 9/2004 | Rinerson et al. | |
| 7,063,985 | B2 * | 6/2006 | Drewes | G11C 11/16 257/E27.005 |
| 7,271,081 | B2 | 9/2007 | Li et al. | |
| 7,303,971 | B2 | 12/2007 | Hsu et al. | |
| 7,382,664 | B2 * | 6/2008 | Le Phan | G11C 7/22 365/158 |
| 7,446,010 | B2 | 11/2008 | Li et al. | |
| 7,608,514 | B2 | 10/2009 | Hsu et al. | |
| 7,732,881 | B2 * | 6/2010 | Wang | G11C 11/15 257/295 |

(Continued)

*Primary Examiner* — Michael Zarroli

(57) ABSTRACT

One embodiment of a nonvolatile memory cell comprises a substrate having a surface, a bidirectional current switch comprising a first electrode, a second electrode, and a semiconductor layer disposed between the first and second electrodes, and a magnetoresistive element having a direct contact with the bidirectional current switch and comprising a free ferromagnetic layer having a reversible magnetization direction, a pinned ferromagnetic layer having a fixed magnetization direction, and a tunnel barrier layer disposed between the free and pinned ferromagnetic layers, wherein the magnetization direction of the free ferromagnetic layer is reversed by a bidirectional spin polarized current running through the magnetoresitive element in a direction perpendicular to the substrate surface, and wherein a magnitude of the spin polarized current is controlled by the bidirectional current switch. Other embodiments are described and shown.

18 Claims, 13 Drawing Sheets

(56) References Cited

U.S. PATENT DOCUMENTS

| | | | |
|---|---|---|---|
| 7,968,419 B2 | 6/2011 | Li et al. | |
| 7,989,794 B2 | 8/2011 | Toda et al. | |
| 8,068,358 B2 | 11/2011 | Maejima | |
| 8,223,565 B2 | 7/2012 | Ueda | |
| 8,227,788 B2 | 7/2012 | Mikawa et al. | |
| 8,355,272 B2 * | 1/2013 | Andre | G11C 11/161 365/148 |
| 8,406,041 B2 | 3/2013 | Shukh | |
| 8,508,984 B2 * | 8/2013 | Ranjan | G11C 11/16 365/158 |
| 8,681,535 B2 * | 3/2014 | Shukh | G11C 14/0081 365/148 |
| 8,773,896 B2 * | 7/2014 | Shukh | G11C 11/16 365/148 |
| 8,802,451 B2 * | 8/2014 | Malmhall | B82Y 10/00 257/295 |
| 8,848,433 B2 * | 9/2014 | Saida | G11C 11/1675 365/158 |
| 9,419,208 B2 * | 8/2016 | Whig | H01L 43/08 |
| 2012/0257449 A1 | 10/2012 | Shukh et al. | |
| 2012/0281465 A1 | 11/2012 | Shukh et al. | |
| 2012/0305879 A1 | 12/2012 | Lu et al. | |
| 2012/0313688 A1 * | 12/2012 | Shukh | H03K 17/693 327/407 |
| 2012/0327701 A1 | 12/2012 | Nazarian | |
| 2015/0249096 A1 * | 9/2015 | Lupino | H01L 27/11898 257/203 |

\* cited by examiner

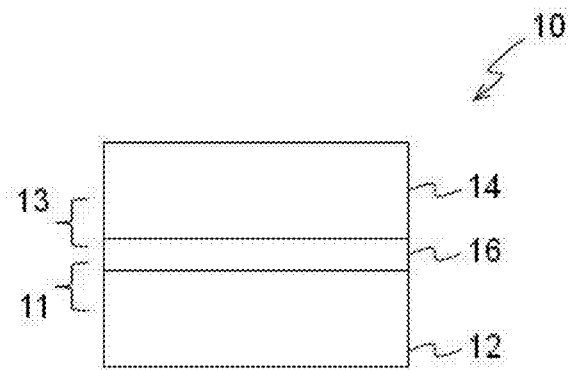
Fig. 1a (Prior Art)
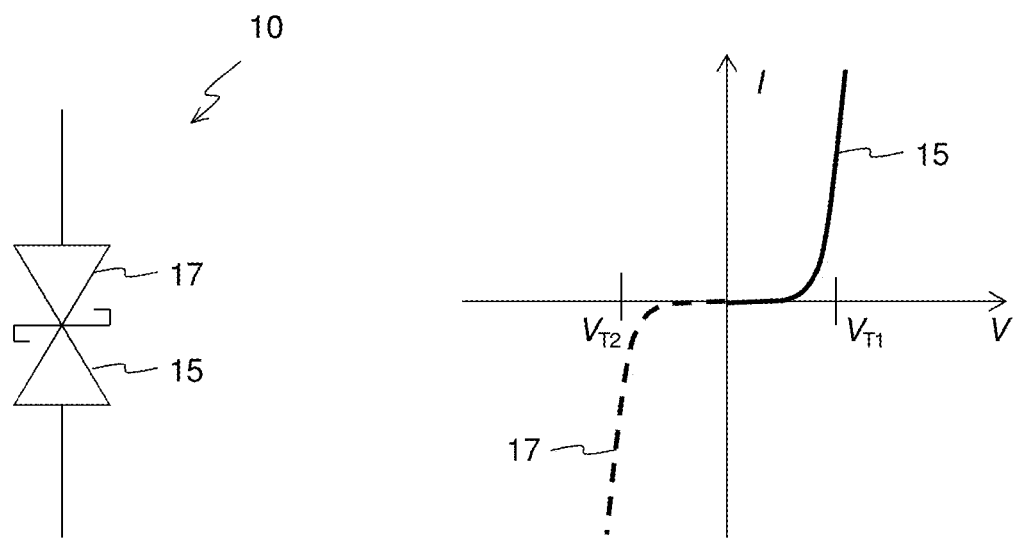
Fig. 1B (Prior Art)
Fig. 1C (Prior Art)

HIGH DENSITY NONVOLATILE MEMORY

CROSS-REFERENCE TO RELATED APPLICATIONS

This application claims benefit of a provisional patent application No. 61/816,803, filed on Apr. 28, 2013 by the present inventor.

FEDERALLY SPONSORED RESEARCH

Not applicable.

SEQUENCE LISTING OF PROGRAM

Not applicable.

RELEVANT PRIOR ART

U.S. Pat. No. 7,271,081 B2, Sep. 18, 2007—Li et al.
U.S. Pat. No. 7,446,010, Nov. 4, 2008—Li et al.
U.S. Pat. No. 7,668,005, Feb. 23, 2010—Ueda
U.S. Pat. No. 8,158,964, Apr. 17, 2012—Kim et al.
U.S. Pat. No. 8,227,788, Jul. 24, 2012—Mikawa et al.

BACKGROUND

New types of memory have demonstrated significant potential to compete with commonly utilized types of memory. For example, non-volatile magnetic random access memory with spin-induced switching (referred to herein as "MRAM"), resistive random access memory (referred to herein as "RRAM"), and phase change random access memory (referred here as PCRAM or PRAM) are considered as potential candidates for the next generation of memory. The ability of MRAM, RRAM and PCRAM to more effectively compete with established memory types, such as dynamic random access memory (DRAM), static random access memory (SRAM) and FLASH memory (NAND or NOR) can be maximized by increasing the density of memory components (a memory cell and its associated driving device) that are formed on a chip.

SUMMARY

One embodiment of a nonvolatile memory cell, comprises a substrate having a surface; a bidirectional current switch comprising a first electrode, a second electrode, and a semiconductor layer disposed between the first and second electrodes, and a magnetoresistive element having a direct contact with the bidirectional current switch and comprising a free ferromagnetic layer having a reversible magnetization direction, a pinned ferromagnetic layer having a fixed magnetization direction, and a tunnel barrier layer disposed between the free and pinned ferromagnetic layers, wherein the magnetization direction of the free ferromagnetic layer is reversed by a bidirectional spin polarized current running through the magnetoresitive element in a direction perpendicular to the substrate surface, and wherein a magnitude of the spin polarized current is controlled by the bidirectional current switch.

Another embodiment of a nonvolatile memory cell comprises a substrate having a surface; a bidirectional current switch; a magnetoresistive element comprising a reversible resistance and connected in series with the bidirectional current switch; a first conductor comprising a magnetic cladding and coupled to a first terminal of the magnetoresistive element opposite to the bidirectional current switch, and a second conductor coupled to a second terminal of the bidirectional current switch opposite to the magnetoresistive element, wherein the resistance of the magnetoresistive element is reversed by a joint effect of a spin-polarized current running through the magnetoresistive element in a direction perpendicular to the substrate surface and a bias magnetic field produced by a bias current running through the first conductor line, and wherein a magnitude of the spin-polarized current is controlled by the bidirectional current switch.

BRIEF DESCRIPTION OF THE DRAWINGS

The disclosure may be more completely understood in consideration of the following detailed description of various embodiments of the disclosure in connection with the accompanying drawings.

FIG. 1A is a schematic diagram illustrating a cross-sectional view of a current switch.

FIG. 1B is a circuit diagram depicting a current switch.

FIG. 1C is a current-voltage (I-V) curve of a current switch.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 2A:
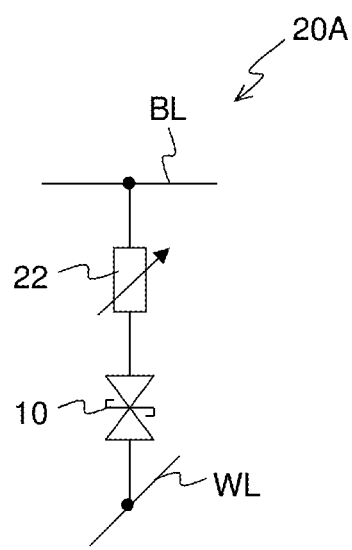
FIGS. 2A and 2B are circuit diagrams of nonvolatile memory cells disclosed herein.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Nonvolatile memory elements such as magnetoresistive element, phase-change element and resistance variable elements employing a bi-directional current for reversal of their resistive state require a current controlling element (a current switch). A back-to-back diode Schottky can serve as the current switch in the nonvolatile memories. The back-to-back Schottky diode can be made of a metal-semiconductor-metal (MSM) structure electrically connected with a memory element. FIGS. 1A through 1C illustrate schematic and circuit diagrams of the current switch employing back-to-back Schottky diode and its current-voltage curve.

A schematic sectional diagram of a current switch 10 based on an MSM back-to-back Schottky diode can be seen in FIG. 1A. The element 10 includes a first conductive electrode 12, a second conductive electrode 14, and a semiconductor layer 16 disposed between the electrodes 12 and 14. The first 12 and second 14 electrodes are physically in contact with the semiconductor layer 16 to form Schottky contacts (or junctions).

Whenever a metal and a semiconductor are in intimate contact, there exists a potential barrier between the two materials that prevents most charge carriers (electrons or holes) from passing from one material to the other material. Only a small number of carriers have enough energy to get over the barrier and cross to the other material. When a bias is applied to the junction, it can have one of two effects: it can make the barrier appear lower from the semiconductor side, or it can make it appear higher from the semiconductor side. The bias does not change the barrier height from the metal side. The result of this is a Schottky barrier, which can also be referred to as a Schottky contact (or junction), where the junction conducts for one bias polarity, but not the other. A Schottky contact has a non-linear and asymmetric current-voltage (I-V) curve.

The Schottky barrier can depend at least in part on the work function of the metal, the band gap of the semiconductor, the type and concentration of dopants in the semiconductor, and other factors. A junction of an undoped or lightly doped semiconductor material and a metal will form a Schottky contact.

A junction of a heavily doped semiconductor material and a metal can form an ohmic contact (the current may flow in either direction: forward biased current in one direction, tunneling in the other (reverse) direction). In general, the junction of a heavily doped semiconductor and a metal forms a thinner energy barrier (the heavier the dopant level, the thinner the barrier will be). At reverse bias conditions, charge can flow through the barrier due to quantum mechanical tunneling.

The first electrode 12 of the current switch 10 shown in FIG. 1A forms a Schottky contact 11 with the semiconductor layer 16. Respectively, the second electrode 14 forms another Schottky contact 13 with the semiconductor layer 16. The Schottky contacts 11 and 13 have opposite or back-to-back coupling. The element 10 comprising two back-to-back Schottky contacts can operate as a bidirectional switch. The bidirectional switch 10 allows current to flow in a first direction when a current having a first polarity is applied and in a second direction (opposite to the first direction) when a current having a second polarity (opposite to the first polarity) is applied.

FIG. 1B depicts a circuit diagram illustrating a bidirectional nature of the current controlling element 10. As seen in the circuit diagram of FIG. 1B, the first contact 11 (see FIG. 1A) can operate as a first diode 15. Respectively, the second contact 13 can operate as a second diode 17. The diodes 15 and 17 are coupled back-to-back (in anti-series) to each other. The first diode 15 allows current to flow in a direction that is opposite to that of the second diode 17.

FIG. 1C shows a current-voltage (I-V) curve of a bidirectional current switch 10. As seen in FIG. 1C, the first diode 15 has a threshold voltage $V_{T1}$ at which a substantial current begins to flow in a first direction. The second diode 17 has a threshold voltage $V_{T2}$ at which a substantial current starts to flow in a second (opposite) direction. As shown in FIG. 1C, the polarity of $V_{T1}$ and $V_{T2}$ are opposite. The threshold voltages $V_{T1}$ and $V_{T2}$ can have similar or different values which correspond to symmetrical or asymmetrical I-V curce. The threshold voltages provide the current switch 10 with a possibility to block a current flow when the voltages less than $V_{T1}$ or higher than $V_{T2}$ are applied to the first or second diodes, respectively. The current switch 10 can allow a current having a first polarity to flow at voltages above $V_{T1}$ and a current of the opposite polarity to flow at voltages below $V_{T2}$. It means, that if a voltage of greater than $V_{T1}$ is applied to the element 10, a current might flow in a first direction; whereas if a voltage of less than $V_{T2}$ is applied to the element 10, a current might flow in a second direction. Hence, the current switch 10 can be used for controlling a magnitude and polarity of the current flowing through a non-volatile memory element. The threshold voltages $V_{T1}$ and $V_{T2}$ depend on material properties and thicknesses of the layers forming the Schottky contacts 11 and 13.

The current switch 10 can provide both bi-directional switching and an ability to withstand a high driving current. The switch 10 can be used in devices or apparatuses where a high switching speed and high driving current density are required. The ability to support the high switching speed and driving current density are especially advantageous for applications in MRAM, RRAM, PCRAM and similar memories.

A symmetrical I-V curve of the back-to-back Schottky diode 10 is illustrated in FIG. 1C. Generally, to provide the symmetrical I-V curve the switching current element should have substantially similar surface area of the metal/semiconductor junctions 11 and 13 and materials of the electrodes 12 and 14. The element 10 with a symmetrical I-V curve can be advantageous in some applications.

The switch 10 can have an asymmetric I-V curve when the junctions 11 and 13 have different surface areas, or the electrodes 12 and 14 are made of different materials, or the semiconductor layer 16 has a different concentration of dopants at opposite sides contacting with the electrodes 12 and 14, or at other conditions.

The semiconductor layer 16 or its portion can be doped. Doping is the process of intentionally introducing impurities into a semiconductor to change its electrical properties. A dopant element can depend at least in part on the particular properties that are desired in the final switch element, on a semiconductor material to be doped, other factors not discussed herein, or a combination thereof. Exemplary dopants can include, but are not limited to Group III and Group V elements. In embodiments where the semiconductor materials are Group IV materials (for example, silicon (Si), germanium (Ge), and silicon carbide (SiC)), Group III or Group V elements can be utilized as dopants. Specific exemplary dopants can include, but are not limited to boron (B), arsenic (As), phosphorus (P), and gallium (Ga).

The electrodes 12 and 14 can be made of an electrically conductive material, such as metals, alloys, oxides and similar. The first 12 and second 14 electrodes can be made of the same material. However, the electrodes 12 and 14 can be made of the different materials.

In an embodiment shown in FIG. 1A, the semiconductor layer 16 can made of amorphous silicon (a:Si) which is doped with phosphorus (P). A thickness of the semiconductor layer can be about 30 nm. The first electrode 12 and the second electrode 14 can be made of platinum (Pt). Thicknesses of the electrodes 12 and 14 can be about 10 nm.

A current switch can be utilized as a selective element electrically coupled to a non-volatile memory element to form a memory cell. A non-volatile memory cell utilized in memory arrays as described herein can include many different types of memory elements. An exemplary type of non-volatile memory element that can be used in memory devices disclosed herein includes, but is not limited to resistive sense memory (RSM) elements. Exemplary RSM elements include, but are not limited to, magnetoresistive RAM (MRAM or STT-RAM); resistive RAM (RRAM); phase change memory (PCM) which is also referred to as PRAM, PCRAM or C-RAM; programmable metallization cell (PMC), which is also referred to as conductive-bridging RAM (CBRAM).

Figure 2B:
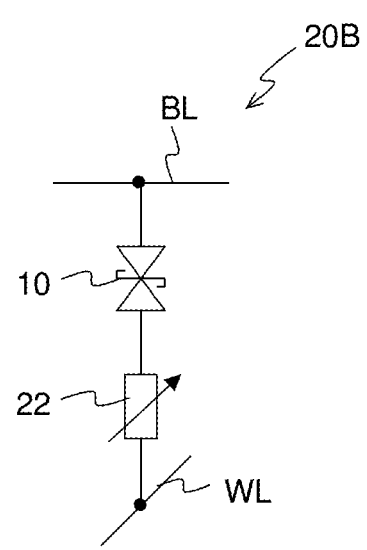

A circuit diagrams of memory cells (MC) 20A and 20B employing an RSM element 22 and a bidirectional current switch 10 are shown in FIGS. 2A and 2B. In the memory cells 20A and 20B the non-volatile memory element 22 is connected in series with the current switch 10. The memory cell can be disposed at an intersection region where a word line (WL) and a bit line (BL) of the memory array (not shown) overlap each other. The memory cell is disposed in a vertical space between the overlapping conductive lines WL and BL. First end (or terminal) of the current switch 10 and the memory element 22 is electrically coupled to overlapping word WL and bit BL lines. The elements 10 and 22 are coupled to each other at their second ends.

FIGS. 2A and 2B show circuit diagrams of the non-volatile memory cells 20A and 20B, respectively. The current switch 10 is a back-to-back Schotky diode 10. The non-volatile memory element 22 is a resistor with a reversible resistance. When a voltage provided by a power supplier (not shown) is greater than $V_{T1}$ (see FIG. 1C) a current will flow in one direction through the memory element 22. When the voltage lower than VT2 is provided the current will flow through the element 22 in opposite direction. The threshold voltages $V_{T1}$ and $V_{T2}$ can prevent a current leakage through the memory element 22 when unwanted voltage will occur between word WL and bit BL lines.

Figure 3A:
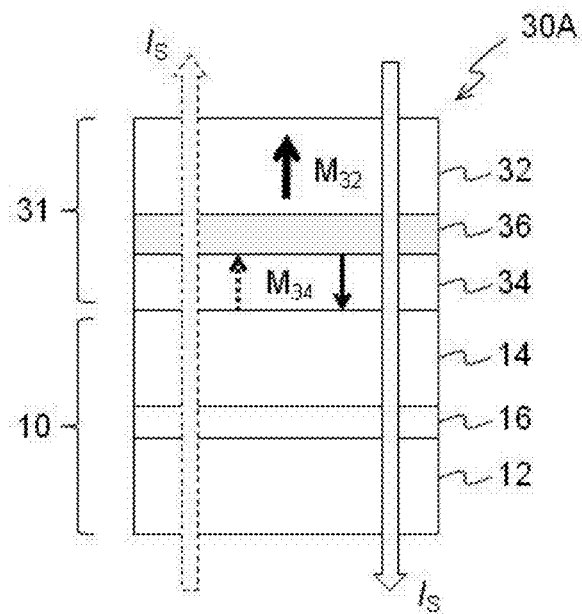
FIGS. 3A and 3B are schematic diagrams illustrating cross-sectional views of perpendicular magnetic memory cells comprising a current switch and a magnetoresistive element.
Figure 3B:
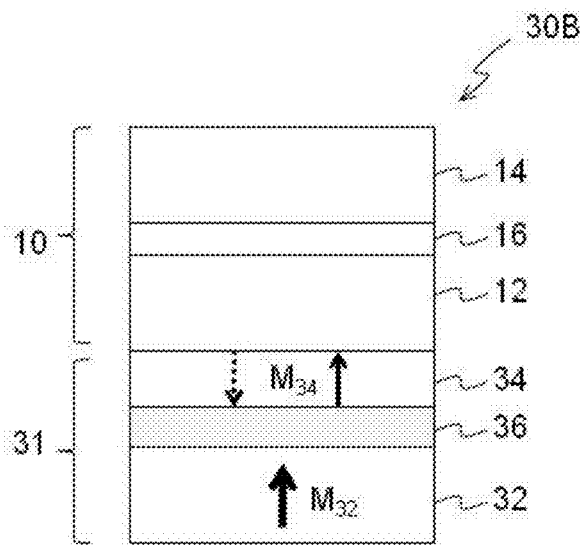

In embodiments, the RSM element can be a magnetoresistive (MR) element (or magnetic tunnel junction (MTJ)). The MR element together with a bidirectional current switch can form a magnetic memory cell. The MR element 31 can comprise two ferromagnetic layers 32 and 34 separated from each other by a thin insulating layer 36, which is also known as a tunnel barrier layer. Embodiments of the magnetic memory cells without conductive word and bit lines are depicted in FIGS. 3A and 3B. The memory cell 30A shown in FIG. 3A comprises a MR element 31 connected in series with a back-to-back Schottky diode 10 that includes a semiconductor layer 16, a first electrode 12, and a second electrode 14. The MR element 31 can include a ferromagnetic layer 32 having a fixed magnetization direction $M_{32}$ (pinned layer), and a ferromagnetic layer 34 having a reversible magnetization direction $M_{34}$ (free layer). The MR element 31 may have a perpendicular magnetization directions $M_{32}$ and $M_{34}$ (or perpendicular anisotropy).

As shown in FIG. 3A, the MR element 31 is formed above the current switch 10 wherein the free layer 34 is disposed on a top surface of the second electrode 14. To provide a perpendicular magnetization direction $M_{34}$ and a substantial magnetoresistance $\Delta R/R$, the free layer 34, the tunnel barrier layer 36 and the pinned layer 32 should have a bcc texture with a (001) plane oriented. This texture supports a coherent tunneling of spin-polarized electrons through the tunnel barrier layer 36 that is essential for a high magnetoresistance and low density of the spin-polarized switching current. The free layer 34 can be made of CoFeVB film of 1.5-nm thick. The tunnel barrier layer 36 can be made of MgO film having a thickness of about 1.1 nm. The pinned layer can be made of a 10-nm thick $Fe_{50}Pt_{50}$ film with a (001) plane being oriented. The second electrode 14 can be made of tungsten (W) that can support both a perpendicular magnetization direction $M_{34}$ and the required bcc (001) crystalline texture in the free ferromagnetic layer 34. Moreover, the tungsten can serve as a material of the second electrode of the Schottky diode 10.

FIG. 3A shows the memory cell 30A wherein the free layer 34 of the MR element 31 is disposed above the second electrode 14. However the MR element 31 may be disposed below the Schottky diode 10 with the free layer 34 having a direct contact with the first electrode 12 as shown in FIG. 3B. The electrode 12 of the memory cell 30B can be made of a tungsten (W). The tungsten can provide simultaneously a Schottky contact with the semiconductor layer 16 and support the perpendicular anisotropy and bcc (001) texture in the free ferromagnetic layer 34. The memory cells 30A and 30B may also include additional layers such as a seed layer, a cap layer and others, which are not shown.

The free layer 34 can perform as a storage layer and can have two stable magnetization directions $M_{34}$ (shown by thin dashed and solid lines) that are parallel or anti-parallel to the magnetization direction $M_{32}$ (shown by a thick solid line) of the pinned layer 32. A resistance of the MR element 31 measured in a direction across the tunnel barrier layer thickness 36 depends on a mutual orientation of the magnetization directions $M_{32}$ and $M_{34}$. The mutual orientation can be effectively controlled by a direction of a spin-polarized switching current $I_S$ running across the MR element 31 perpendicular to substrate surface (not shown). The spin-polarized current $I_S$ can reverse the magnetization direction $M_{34}$ of the free layer 34 and hence, change the resistance of the element 31. The resistance of the MR element 31 is low when the magnetization directions of the free $M_{34}$ and pinned $M_{32}$ layers are parallel to each other (logic "0"). The resistance of the MR element 31 is high when the magnetization directions $M_{32}$ and $M_{34}$ are antiparallel to each other (logic "1"). A difference in the resistances of two logic states can be up to about 600% or higher.

Writing data to the free layer 34 can be provided by a spin-polarized current $I_S$ running through the MR element 31 in the direction perpendicular to the substrate (not shown). More specifically, when the spin-polarized current $I_S$ flows from the free layer 34 to the pinned layer 32 through the tunnel barrier layer 36 (large dashed upward arrow), the conductance electrons run in the opposite direction from the pinned layer 32 to the free layer 34. The electrons storing a spin information of the pinned layer 32 are injected into the free layer 34. A spin angular momentum of the injected electrons can be transferred to electrons of the free layer 34 in accordance with a law of spin angular momentum conservation. This can force the magnetization direction $M_{34}$ (dashed arrow) of the free layer 34 to be oriented in parallel with the magnetization direction $M_{32}$ of the pinned layer 32 (low resistance state).

On the other hand, when the spin-polarized write current $I_S$ flows from the pinned layer 32 to the free layer 34 (large solid downward arrow), the spin-polarized electrons run in the opposite direction from the free layer 34 to the pinned layer 32. The electrons having the spin oriented in parallel to the magnetization direction $M_{32}$ of the pinned layer 32 are transmitted. The electrons having the spin antiparallel to the magnetization direction of the pinned layer 32 are reflected. As a result, the magnetization orientation $M_{34}$ (solid arrow) of the free layer 34 is forced to be directed antiparallel to the magnetization direction of the pinned layer 32 (high resistance state).

Reading of the data stored in the MR element 31 can be provided by measuring its resistance and comparing it with the resistance of the reference element (not shown).

FIG. 3B depicts a schematic diagram of the magnetic memory cell 30B that includes a MR element 31 disposed below the current switch 10. The free layer 34 may have a direct contact with the first electrode 12 made of the tungsten (W) to provide a high $\Delta R/R$ and bcc (001) texture. The memory cell 30B functions similarly to the memory cell 30A.

Figure 4A:
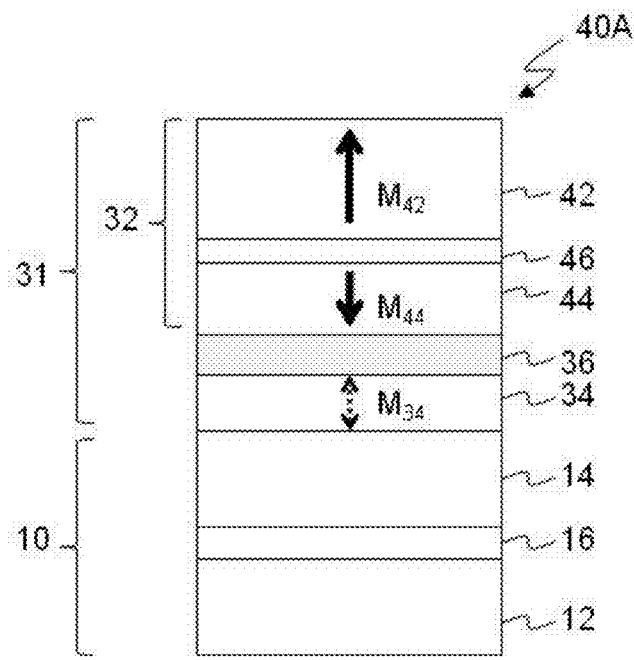
FIGS. 4A and 4B are schematic diagrams illustrating a cross-sectional views of perpendicular magnetic memory cells comprising a current switch and a magnetoresistive element with a pinned layer having a structure of a synthetic anti-ferromagnetic.
Figure 4B:
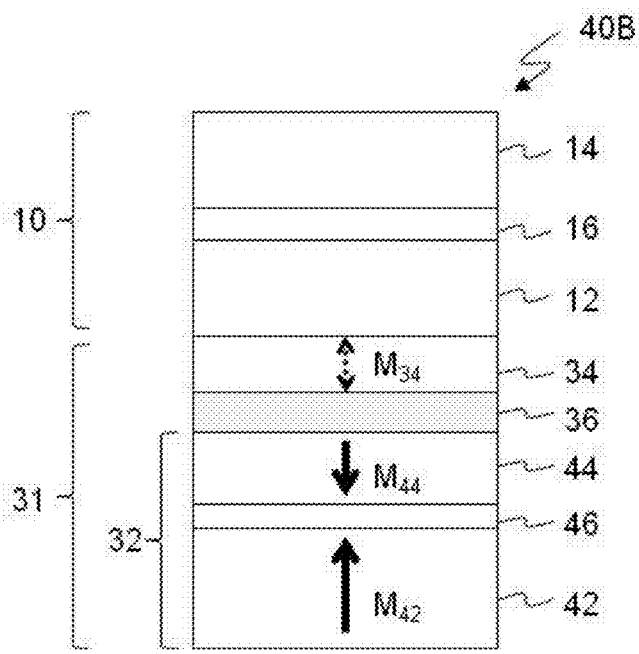

FIGS. 4A and 4B depict a magnetic memory cells 40A and 40B which comprise a perpendicular MR element 31 with a pinned layer 32 having a structure of a synthetic anti-ferromagnetic. The pinned layer 32 can include a pinned ferromagnetic layer 42 and a reference ferromagnetic layer 44 which are substantially antiferromagnetically exchange coupled to each other through a spacer layer 46 made of a nonmagnetic metal such as Ru. The pinned layer 42 may have a substantial coercivity (above 1000 Oe) and a fixed magnetization orientation $M_{42}$. The magnetization direction $M_{44}$ of the reference layer 44 is fixed by the antiferromagnetic exchange coupling with the pinned layer 42. The antiferromagnetic structure of the pinned layer 32 can provide a cancelation of a fringing magnetic field produced by the pinned layer 32 in the vicinity of the free layer 34. The cancellation of the fringing field can provide equal magnitudes of the spin-polarized current $I_S$ required for writing logic "0" or "1". Moreover, the synthetic pinned layer can improve a thermal stability of the MR element 31 and, more specifically, the thermal stability of the free layer 34.

The magnetic memory cells 40A and 40B distinguish from each other by a position of the current switch 10 relatively to the MR element 31. Other positions of the free and pinned layers in the MR element 31 of the memory cells 40A and 40B relatively to the current switch 10 are possible. The memory cells 40A and 40B may also includes additional layers or multilayers.

The free layer 34 of the memory cell 40A can be made of (Co/Pt(2.5 nm))/CoFeB(1.5 nm) multilayer. The pinned layer 42 can be made of (Co/Pt) superlattice having a thickness of about 10 nm. The reference layer 44 can be made of CoFeB having a thickness of about 2 nm. The reference layer 44 is substantially antiferromagnetically exchange coupled with the pinned layer 42 through a layer of Ru (ruthenium) having a thickness of about 0.8 nm. Each of the layers 34 and 44 has a direct contact with the tunnel barrier layer 36 made of MgO and having a thickness of about 1.1 nm.

Figure 5:
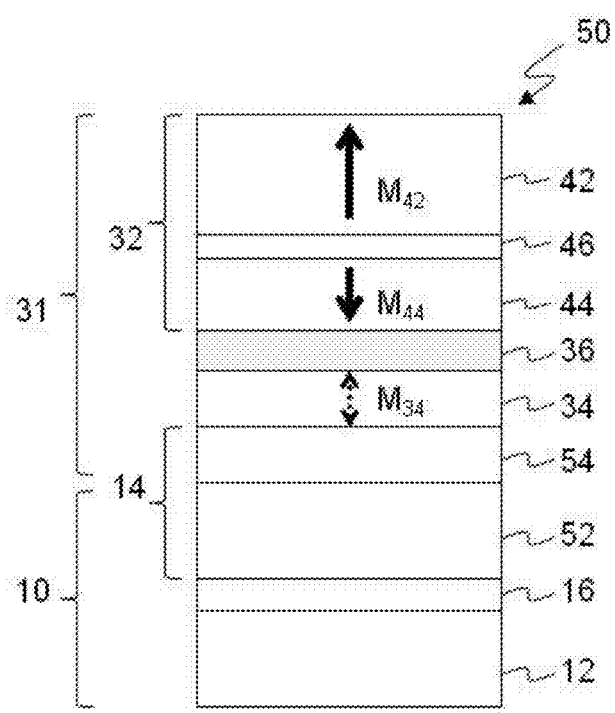
FIG. 5 is a schematic diagram illustrating a cross-sectional views of perpendicular magnetic memory cell comprising a current switch with a laminated top electrode.

A memory cell 50 shown in FIG. 5 is a modification of the memory cell 40A (FIG. 4A). The second electrode 14 has a multilayer structure comprising at least two layers 52 and 54. The layer 52 has a direct contact with the semiconductor layer 16. The layer 54 has a direct contact with the free magnetic layer 34. The layer 52 can be made of 10-nm thick film of platinum (Pt) to provide a Schottky contact with the semiconductor layer 16. The layer 54 can be made of 5-nm thick film of hafnium (Hf) to support a perpendicular anisotropy and bcc (001) structure in the free magnetic layer 34. The electrode 14 can have any number of the layers.

Figure 6:
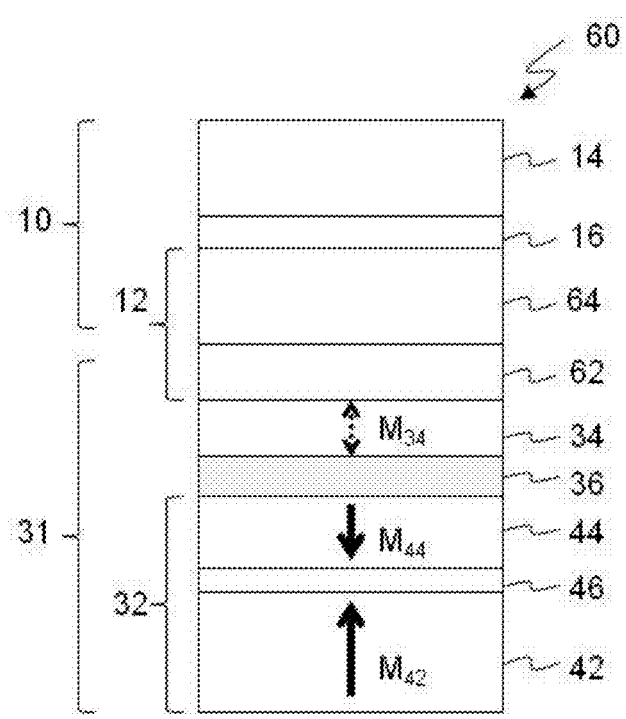
FIG. 6 is a schematic diagram illustrating a cross-sectional views of perpendicular magnetic memory cell comprising a current switch with a laminated bottom electrode.

FIG. 6 shows a schematic diagram of a memory cell 70 that is a modification of the memory cell 40B shown in FIG. 4B. The first electrode 12 of the memory cell 60 has a multilayer structure comprising at least two layers 62 and 64. The layer 62 has a direct contact with the free layer 34. It can be made of 5-nm thick film of Ta supporting a perpendicular anisotropy and bcc (001) structure in the free magnetic layer. The layer 64 has a direct contact with the semiconductor layer 16. It can be made of 10-nm thick film of Pt providing a Schottky contact with the semiconductor layer. The electrode 12 can have any number of the layers.

Figure 7A:
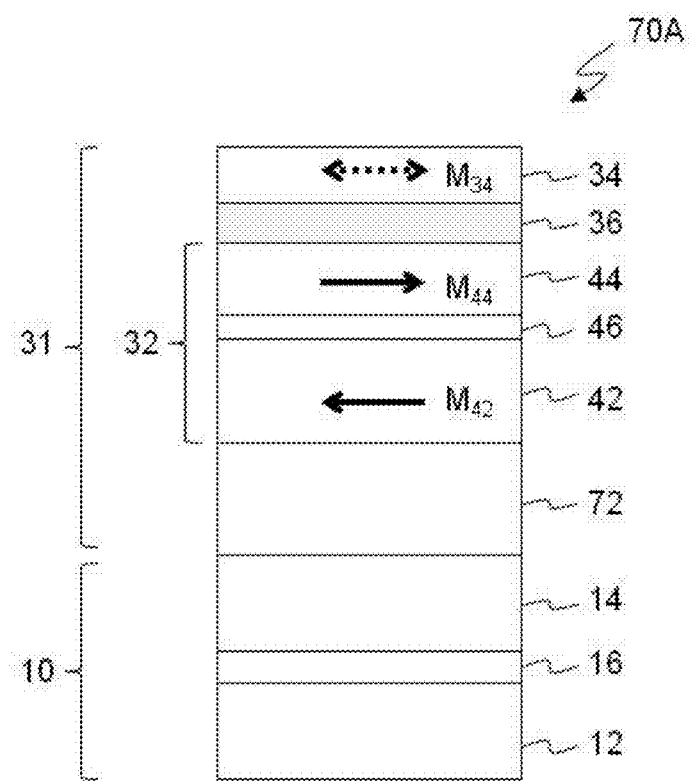
FIGS. 7A and 7B are schematic diagrams illustrating a cross-sectional views of in-plane magnetic memory cells comprising a current switch and an magnetoresistive element with a pinned layer having a structure of synthetic anti-ferromagnetic.
Figure 7B:
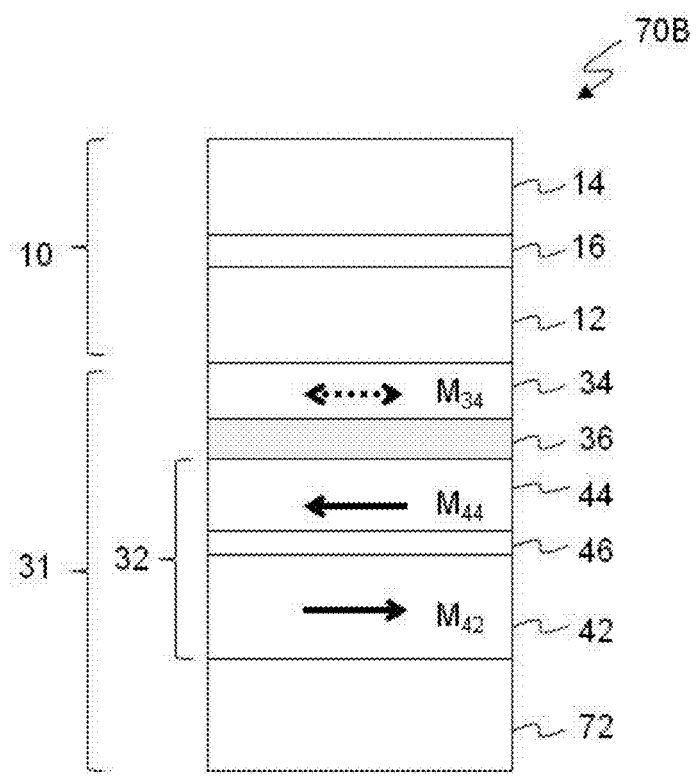

FIGS. 7A and 7B show schematic diagrams of magnetic memory cells 70A and 70B which employ a MR element 31 comprising magnetic materials with in-plane magnetization.

The magnetization directions of the free, pinned and reference layers are depicted by dashed or solid arrows $M_{34}$, $M_{42}$, and $M_{44}$, respectively. To fix the magnetization direction $M_{42}$ in the pinned layer 42, the layer has a substantial exchange coupling with an antiferromagnetic layer 72. The layers 42 and 72 are in a direct contact with each other. The magnetization direction $M_{44}$ of the reference layer 44 is fixed by means of antiferromagnetic exchange coupling with the pinned layer 42 through the spacer layer 46. The memory cells 70A and 70B distinguish from each other by a position of the current switch 10 relatively to the MR element 31. The memory cells 70A and 70B may have an elliptical shape to provide a required thermal stability to the free layer 34 made of a material with in-plane magnetization direction (anisotropy). Note, that the memory cells 70A and 70B may have different order of the layers and additional layers or laminates, such as seed, cap, spacer layers and others.

The free ferromagnetic layer 34 of the memory cells 70A and 70B can be made of CoFeB having a thickness of about 2.2 nm. The pinned layer 42 can be made of CoFe having a thickness of about 3 nm. The pinned layer 42 is substantially antiferromagnetically exchange coupled with the antiferromagnetic layer 72 made of IrMn and having a thickness of about 10 nm. The reference layer 44 can be made of CoFeB with a thickness of about 2.5 nm. The magnetic layers 42 and 44 are substantially antiferromagnetically exchange coupled to each other through a nonmagnetic spacer layer 46. The spacer layer 46 can be made of Ru with a thickness of about 0.85 nm. The tunnel barrier layer 36 can be made of MgO having a thickness of about 1.1 nm.

In embodiments, the memory cells can comprise a resistive sense memory (RSM) element such as a phase change memory (PCM) element, or resistance change memory (RCM) element used in RRAM and similar. The RSM element have two logic states: high and low resistance which can be controlled by a polarity (direction) and magnetitude of switching current running through the current switch.

Figure 8:
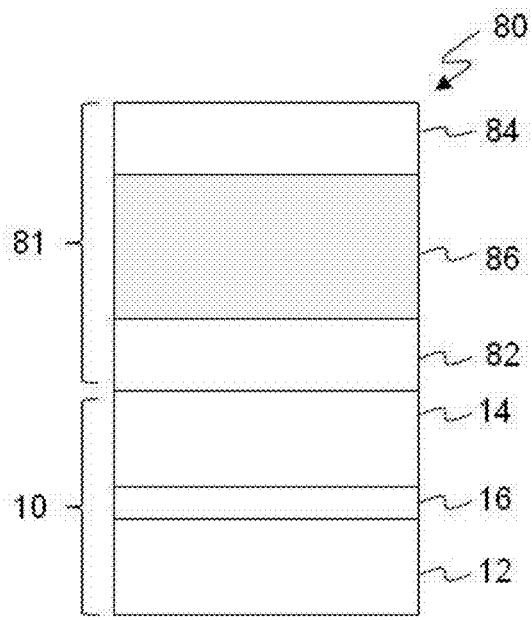
FIG. 8 is a schematic diagram illustrating a cross-sectional view of a resistive memory cell comprising a current switch and a resistance variable element.

FIG. 8 shows a schematic diagram illustrating a cross-sectional view of a resistive random access memory (RRAM) cell 80. The RRAM cell 80 can comprise a RCM element 81 and a back-to-back diode Schottky 10 which are coupled in series. The RCM element 81 can comprise a medium layer 86 that can alter its resistance in response to an electrical current pulse. This phenomenon can be referred to as the electrical pulse induced resistance change effect by changing a chemical composition of the medium layer 86. The effect causes a resistance change (i.e., logic state) of the memory element from a high to low resistance state or vice-versa. The medium layer 86 is interposed between a first contact layer 82 and the second contact layer 84, and acts as a storage layer. The first contact layer 82 and a second contact layer 84 can be made of an electrically conducting material, for example, Pt, Ni, Cu, Ru, Ag, W, Ir, Au and similar, their based alloys and laminates.

The material forming the medium layer 86 can be any known material used in RRAM. In embodiments, the material forming the medium layer 86 can include an oxide material such as, a metal oxide. In some embodiments, the metal oxide is a binary oxide material or complex metal oxide material.

The binary metal oxide material can be expressed as a chemical formula of $M_xO_y$. In this formula, the characters "M", "0", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), tantalum (Ta), zirconium (Zr), hafnium (Hf), cobalt (Co), iron (Fe), copper (Cu), chrome (Cr), and/or similar. Specific examples of binary metal oxides that may be used as the medium layer 86 include CuO, NiO, CoO, ZnO, $CrO_2$, $TiO_2$, $HfO_2$, $ZrO_2$, $Fe_2O_3$, $Nb_2O_5$ and similar, their laminates. The metal oxide can be any useful complex metal oxide such as, for example, $Pr_{0.7}Ca_{0.3}MnO_3$, or $SrTiO_3$, or $SiZrO_3$ and similar, or these oxides doped with Cr or Nb. The complex can also include $LaCuO_4$, or $Bi_2Sr_2CaCu_2O_8$.

Figure 9:
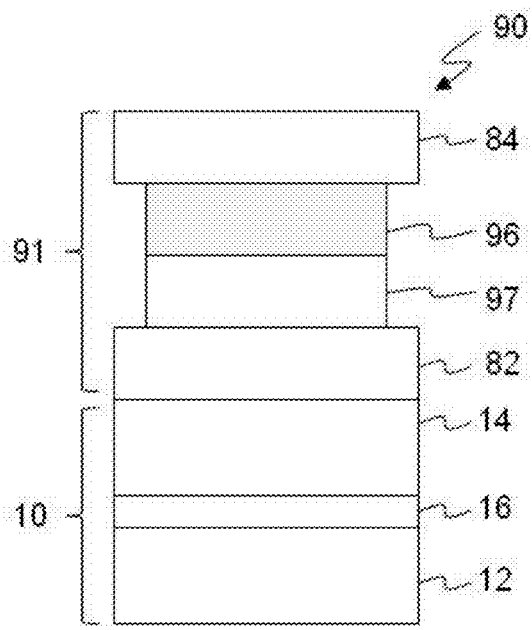
FIG. 9 is a schematic diagram illustrating a cross-sectional view of a phase change memory cell comprising a current switch and a phase change memory element.

The RSM cell can also include a phase change memory (PCM) element. FIG. 9 shows a schematic diagram illustrating a cross-sectional view of a memory cell 90 comprising a current switch 10 connected in series with a PCM element 91. The PCM element 91 can include a first contact layer 82, a second contact layer 84, a heating electrode 97 and a medium layer 96. The layer 96 can comprise a chalcogenide solid electrolyte material or an organic/polymer material. The layer 96 can have two crystalline structures: amorphous, which corresponds to a high resistance state, and polycrystalline, which corresponds to the low resistance state. The structure of the layer 96 can be controlled by a magnitude and a duration of current running through the memory cell 90. Another example of a solid chalcogenide material can be a germanium-selenide $(Ge_xSe_{100-x})$ containing a silver (Ag) component.

Figure 10A:
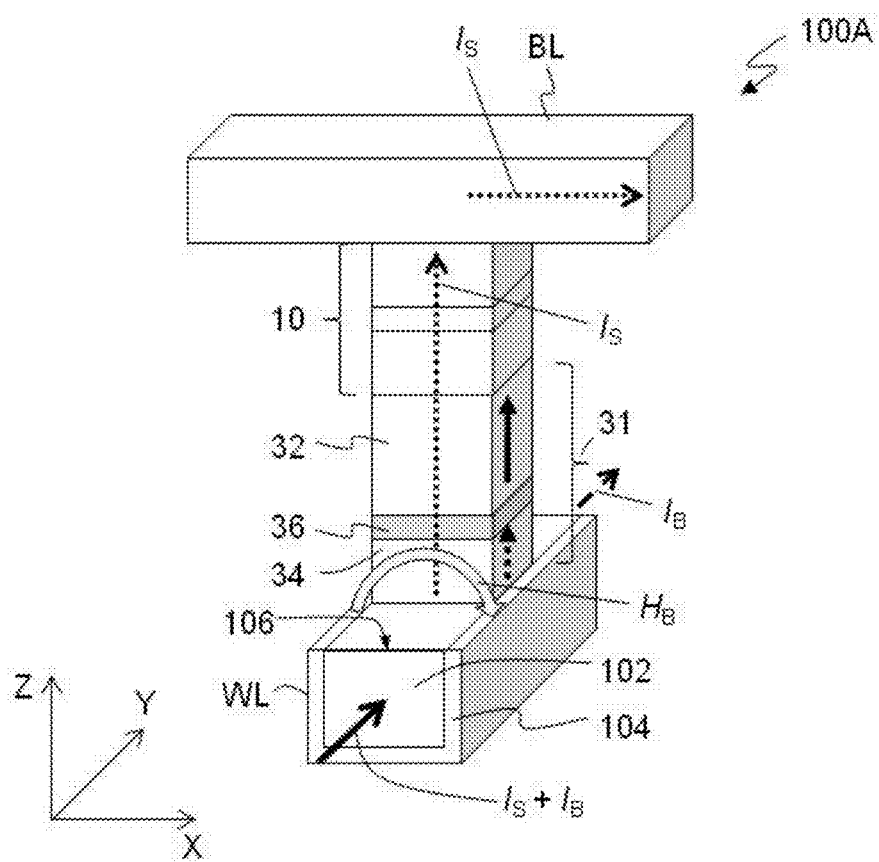
FIGS. 10A and 10B are schematic diagrams of the magnetic memory cells shown in FIGS. 4A and 4B employing a hybrid write mechanism.
Figure 10B:
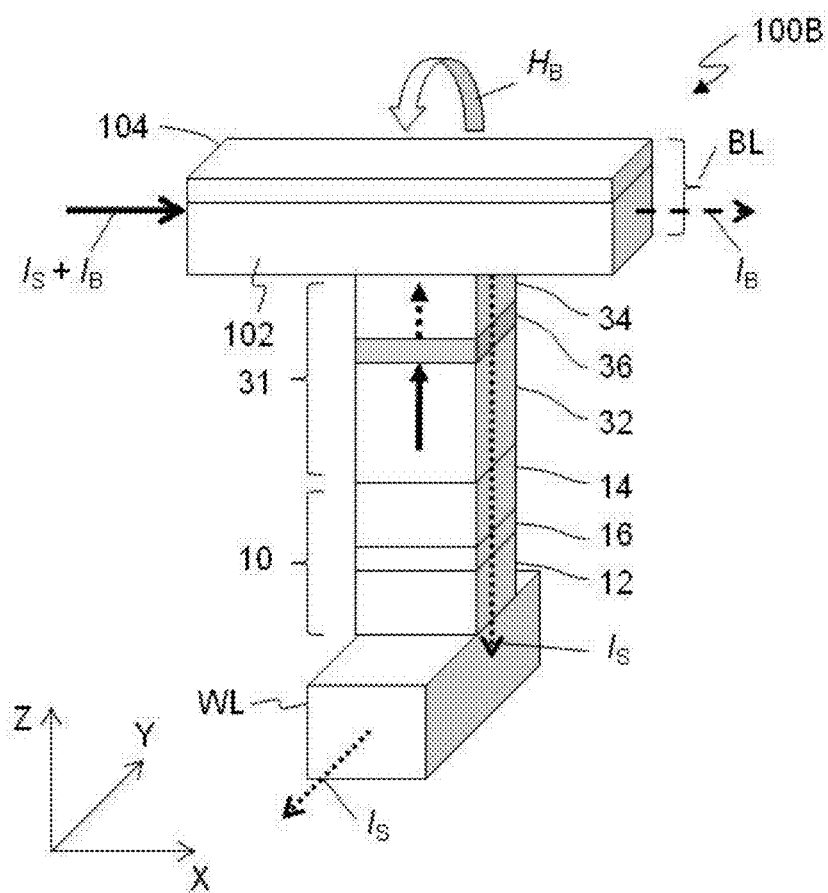

FIGS. 10A and 10B show schematic diagrams of magnetic memory cells 100A and 100B comprising a MR element 31 and a current switch 10, which are connected in series and are coupled to overlapping word WL and bit BL lines. A pinned 32 and free 34 layers of the MR element 31 can comprise magnetic materials with a perpendicular anisotropy. The MR element can employ a hybrid write mechanism that is based on a joint effect of a spin-polarized current A and a bias magnetic field $H_B$ simultaneously applied to the element 31. The bias magnetic field $H_B$ is produced by a bias current $I_B$ supplied through the word line WL (FIG. 10A) or the bit line BL (FIG. 10B). The bias current $I_B$ running through a conductor line (WL or BL) produces the bias magnetic field $H_B$ (shown by arrow) that is applied along a hard magnetic axis of the free layer 34. To localize and magnify the bias magnetic field in the vicinity of the MR element 31 the word line WL (FIG. 10A) may comprise a conductor wire 102 with a magnetic flux concentrator (magnetic flux cladding) 104 and non-magnetic gap 106. The magnetic flux concentrator 104 can be made of a soft magnetic material having a substantial permeability and a low coercivity, for example NiFe. The free layer 34 is disposed adjacent to the conductor line with the running bias current $I_B$ where the bias magnetic field $H_B$ has a maximum. Additional layers, such as seed and/or cap layers or laminates can be placed between the MR element 31 and the conductor line. The hybrid write mechanism can provide a substantial reduction of the spin-polarized current A, an increase of switching speed and endurance of the MR element 31 along with other advantages.

Figure 11:
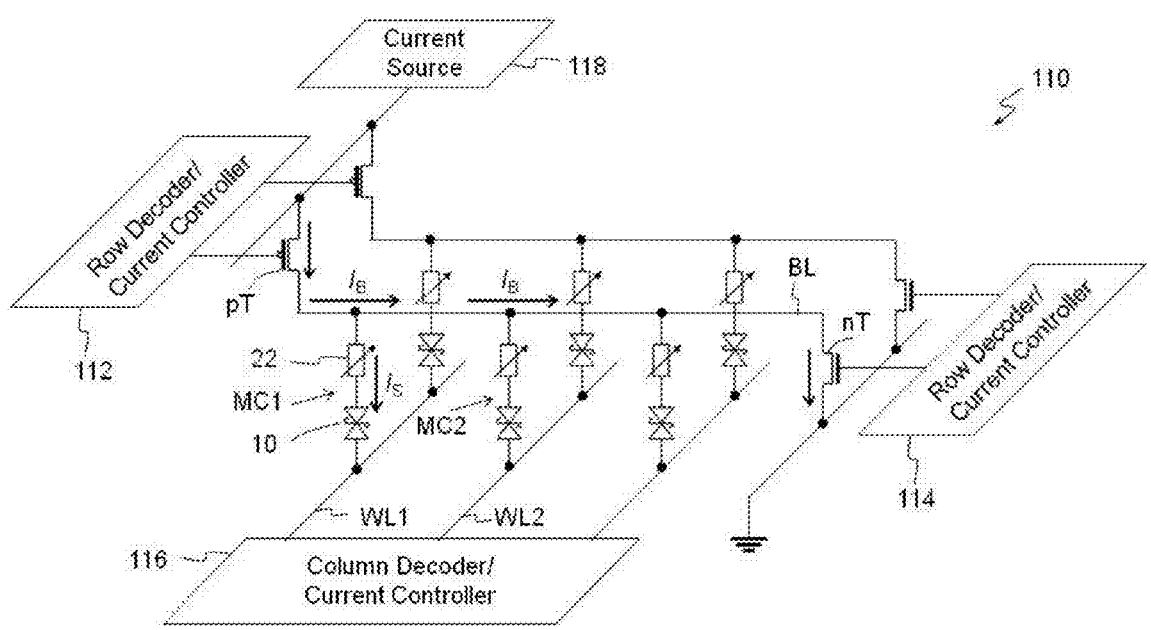
FIG. 11 shows a circuit block diagram of a 2D nonvolatile memory comprising one layer of the memory cells according to the present application.

In embodiments, memory cells disclosed above can be used in crossbar memory arrays. An exemplary depiction of a two dimensional (2D) crossbar memory array is illustrated in FIG. 11. The crossbar memory array 110 comprises a first layer of parallel conductive word lines WL that are overlapped by a second layer of parallel conductive bit lines BL. In embodiments, the conductive bit lines BL can be substantially perpendicular, in orientation, to the conductive word lines WL. In embodiments, the orientation angle between the word and bit lines may be other than perpendicular. Two layers of conductive lines form a lattice, or crossbar, each bit line BL overlying all of the word lines WL and coming into close contact with each word line WL at lines intersections that represents the closest distance between two conductive lines. The conductive word and bit lines can have rectangular, square, circular, elliptical, or any other regular or irregular cross sections. The conductive word and bit lines may have different widths or diameters and aspect ratios or eccentricities.

Memory cells as disclosed above can be arranged into array and be disposed at conductive lines intersections. A conductive lines intersection connected by disclosed memory cells can be referred to as a "crossbar junction." As shown in FIG. 11, the two conductive lines are not in physical contact at their overlap point. An existing gap between the word line WL and the bit line BL is spanned by the memory cell MC that is disposed between the two lines at their closest overlap point. Each memory cell MC of the memory 110 can comprise a current switch 10 connected in series with a memory element 22. Each memory cell is electrically coupled to an appropriate word line WL at a first terminal and to an appropriate bit line BL at a second terminal. The word lines WL are electrically coupled to a column decoder 116. Opposite ends of the bit lines BL are electrically coupled to row decoders 112 and 114 through p-type pT and n-type nT MOS transistors connected in series. Source terminals of the p-type transistors are coupled to a current source 118. Source terminals of the n-type transistors nT are coupled to a ground. Selection of a memory cell MC in the memory 110 can be done by applying appropriate signals to a bit BL and a word WL lines simultaneously. The selected memory cell MC is located at the intersection of these lines.

To write to a MR element 22 of the memory cell MC1 a bias current $I_B$ is supplied to the bit line BL by applying appropriate input signals to gate terminals of the transistors pT (negative signal) and nT (positive signal). The bias current $I_B$ running through the bit line BL produces a bias magnetic field $H_B$ that is applied along a hard magnetic axis of a free layer (not shown) of the MR element 22. The bias field can cause a departure of a magnetization direction in the free layer from its equilibrium state that is perpendicular to a film surface. The magnitude and duration of the bias magnetic field can be controlled effectively by the input signals applied to the gates of the transistors pT and nT. The bias current $I_B$ alone cannot cause a reversal of the magnetization direction in the MR element 22. The reversal of the magnetization direction in the free layer is a joint effect of the bias magnetic field $H_B$ and a spin momentum transfer of spin polarized electrons of the current $I_S$ running through the MR element 22. To cause switching a spin-polarized current $I_S$ is supplied to the MR element 22. The current $I_S$ is running from the transistors pT to the decoder 116 through the MR element 22 located at the intersection of the bit line BL and word line WL1. The joint effect of the bias magnetic field and spin-polarized current can result in a change of logic state of the MR element 22. The adjacent unselected memory cells coupled to the activated bit line BL do not suffer from a current leakage and unwanted writing to their MR elements since a voltage applied to the unselected memory cells is less than a threshold voltages $V_{T1}$ or $V_{T2}$ of the back-to-back Schottky diodes 10.

The memory 110 can also provide simultaneous writing to several memory cells coupled to the energized bit line BL. For example, to write simultaneously to the memory cells MC1 and MC2 appropriate voltages need to be supplied to these memory cells from a column decoder 116 through the word lines WL1 and WL2. Number of the memory cells selected for simultaneous writing can be any.

Figure 12:
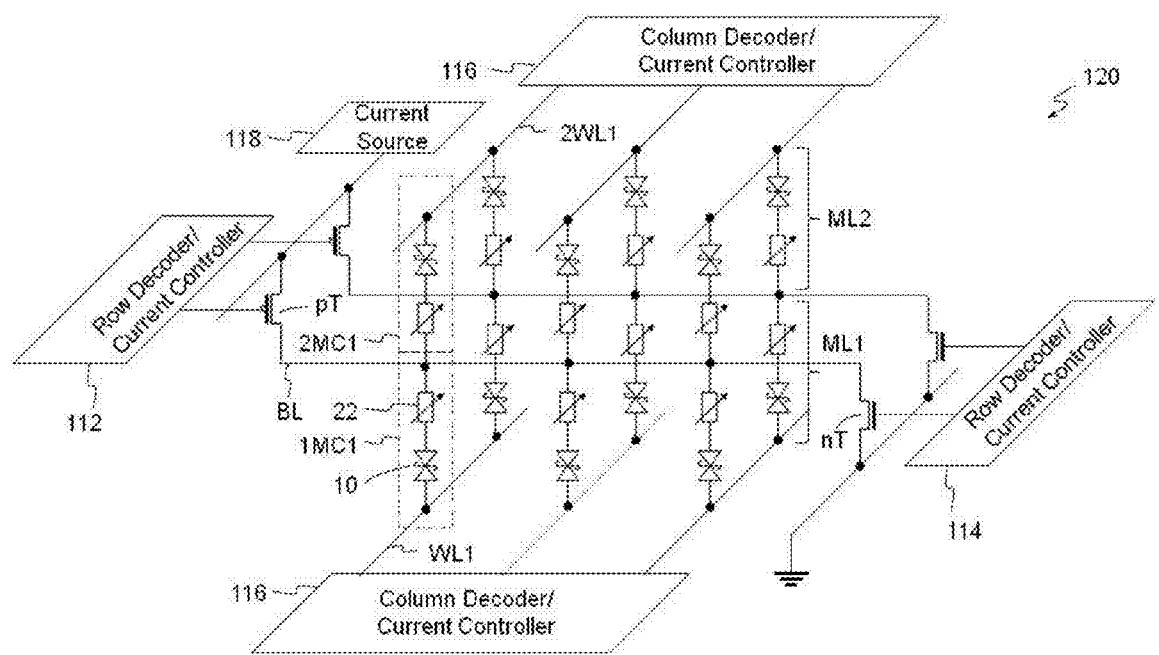
FIG. 12 shows a circuit block diagram of a 3D nonvolatile memory comprising two layers of the memory cells according to the present application.

FIG. 12 shows a circuit diagram of a three dimensional (3D) nonvolatile memory 120 according to another embodiment employing memory cells disclosed herein. The memory 120 comprises two memory layers ML1 and ML2. Each memory layer comprises an array of memory cells MC disposed at intersection regions of the word and bit lines. Each memory cell MC comprises a memory element 22 connected in series with a current switch 10. In the given exemplary embodiment the memory layers ML1 and ML2 are jointly connected to the bit lines BL at their first terminal adjacent to the memory elements 22. Second terminals of the memory layers ML1 and ML2 are separately coupled to appropriate world lines of different memory layers. The memory 120 is shown comprising two memory layers ML1 and ML2. Note, that a number of the memory layers can be any. The first memory layer ML1 comprises an array of the memory cells 1MCn coupled between the word lines 1WLn and the bit lines BLn. The memory cells 2MCn of the second layer ML2 are coupled between the bit lines BLn and the second word lines 2WLn. Note, that the memory cells 1MCn and 2MCn can be jointly coupled to the bit lines BLn at their terminals adjacent to the current switches 10. An operating mechanism of the memory 120 is similar to that disclosed above for the memory 110 (FIG. 110).

There is wide latitude for the choice of materials and their thicknesses within the embodiments of the present disclosure. For example, the semiconductor layer 16 can comprise any semiconductive material. Exemplary semiconductors that can be utilized for the semiconductor layer 16 include, but are not limited to, amorphous, polycrystalline and crystalline silicon (Si), Si containing compounds, germanium (Ge), Ge containing compounds, aluminum (Al) containing compounds, boron (B) containing compounds, gallium (Ga) containing compounds, indium (In) containing compounds, cadmium (Cd) containing compounds, zinc (Zn) containing compounds, lead (Pb) containing compounds, and others. Exemplary elemental and compound semiconductors also include, but are not limited to, Si, a:Si, poly-Si, Ge, SiC, SiGe, AlSb, AlAs, AN, AlP, BN, BP, BAs, GaSb, GaAs, GaN, GaP, InSb, InAs, InN, InP, $Al_xGa_{1-x}As$, $In_xGa_{1-x}As$, InGaP, AlInAs, AlInSb, GaAsN, GaAsP, AlGaN, AlGaP, $InO_2$, InGaN, InAsSb, InGaSb, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, $ZnO_2$, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $SnO_2$, $In_2O_3$, CdO, $Cu_2O$, InGaZnO, $(In,Sn)_2O_3$, ZnSnO, ZnO, InZnO $AgSbO_3$, $2CdO.GeO_2$, $2CdO.PbO$, $CdS.In2S_x$, $TiO_2$, $SrTiO_3$, $MoO_3$, $(In,Sn)_2O_3/TiO_2$, and others. A thickness of the semiconductor layer 16 can be in a range of about 5 nm to 100 nm, and more specifically in a range of about 15 nm to 40 nm.

The semiconductor layer 16 or its portion can be doped. Doping is the process of intentionally introducing impurities into a semiconductor to change its electrical properties. A dopant material (element) can depend at least in part on the particular properties that are desired in the final switching element, the semiconductor material to be doped, other factors not discussed herein, or a combination thereof. Exemplary dopants can include, but are not limited to Group III and Group V elements. In embodiments where the semiconductor materials are Group IV materials (for example, silicon, germanium, and silicon carbide), Group III or Group V elements can be utilized as dopants. Specific exemplary dopants can include, but are not limited to boron (B), arsenic (As), phosphorus (P), and gallium (Ga).

Electrodes 12 and 14 can be made of materials that include, but are not limited to Pt, Ir, Al, Cu, AlCu, Au, Ag, Pd, Rh, W, Ti, Ta, Cr, V, Co, Ni, Fe, TiN, TaN, WSi, TiSi, PtSi, PdSi, NiSi, their based alloys such as NiCr, TiW and others.

A pinned layer 32 can have a thickness in a range of about 1 nm to 100 nm and, more specifically, of about 2-50 nm and coercivity measured along its easy magnetic axis of about 1000 Oe or higher and more specifically of about 2000-5000 Oe. The layer 32 can be made of magnetic material with perpendicular anisotropy comprising Co, Fe or Ni, their based alloys such as FePt, FePd, CoPt, CoCrPt, CoTaPt, CoNiPt, CoFePt, CoCrNb, TbFe, TbCo, TbFeCo, GdTbCo or similar, and/or their based laminates such as Co/Pt, Co/Pd, Fe/Pt, CoFe/Pt, CoFe/Pd, CoFeB/Pt, Ni/Co, Fe/W, Fe/Ta, CoFe/Ta, CoFe/W, Fe/TbFe, CoFe/Ta and/or similar.

The free layer 34 can have a thickness in a range of about 1 nm to 5 nm and, more specifically, of about 1.5-2.5 nm and a coercivity less than 500 Oe and more specifically of about 50-200 Oe. The free layer 34 can be made of a soft magnetic material with a perpendicular anisotropy or in-plane anisotropy such as Co, Fe or Ni based alloys such as CoFeB, FeB, CoFeCrB, CoFeVB, FeCrB, FeVB or similar, and/or multilayers and laminates such as CoFeB/(CoFe/Pt), CoFeB/(Co/Pd), CoFe/W, CoFeB/Ta, CoFeB/Cr, Co/Pt, Co/Pd, Co/Au, CoFe/Pt, Fe/Pt, Fe/Pd, CoFe/TbFeCo, CoFeB/GdFeCo or similar.

The tunnel barrier layer 36 can have a thickness in a range of about 0.5 nm to 2.5 nm and, more specifically, of about 0.8-1.3 nm. The tunnel barrier layer can be made of MgO, $Al_2O_3$, $Ta_2O_5$, $TiO_2$, Mg—MgO, ZrOx and similar materials and/or their based multilayers.

The pinning layer 72 can be made of an antiferromagnetic material such as Mn-based alloys FeMn, IrMn, PtMn, CrPtMn, NiMn and similar. A thickness of the antiferromagnetic layer 72 can be in a range of about 3 nm to 100 nm and, more specifically, of about 10-20 nm.

The bit BL and word WL conductor lines can be made of Al, Cu, Au, Ag, W, Mo, AlCu, Ta/Au/Ta, Cr/Cu/Cr, Mo/Au/Mo, TiN, poly-Si and/or similar materials and/or their based laminates.

The magnetic layers 42 and 44 of the pinned layer 14 having a synthetic antiferromagnetic structure can have a thickness in a range of about 0.5 nm to 25 nm. They can be made of Fe, Co or Ni based alloys and/or their based laminates such as CoFe, CoFeB, CoFeVB, FeB, FeVB, NiFe, NiFeCo and similar. The layers 42 and 44 can have a thickness in a range of about 0.5 nm to 20 nm and, more specifically, of about 1-10 nm.

A spacer layer 46 can be made of Ru, Ir, Rh, Re, Os, Cu, Cr, Ta, W, their based alloys or laminates. A thickness of the spacer layer can be in a range of about 0.25 nm to 25 nm and more specifically, of about 0.5-2.5 nm.

Thus, embodiments of memory cell comprising a current controlling element made of a back-to-back Schottky diode connected in series with a RSM element are disclosed. It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

Disclosed memory cells may be advantageously utilized in memory arrays because the current switch that is included in the memory cells can function as an integrated selective element that can avoid or minimize disturbances on unintended switching of memory elements during read, write and erase operations due to sneak currents.

What is claimed is:

1. A nonvolatile memory cell comprising:
   a substrate having a surface;
   a magnetoresistive element comprising a free ferromagnetic layer having first reversible magnetization direction, a pinned ferromagnetic layer having a second fixed magnetization direction, a tunnel barrier layer disposed between the free and pinned ferromagnetic layers; and
   a bidirectional current switch coupled in series with the magnetoresistive element and comprising a first electrode, a second electrode, and a semiconductor layer disposed between the first and second electrodes,
   wherein the first electrode comprising a first conductive layer having a direct contact with the semiconductor layer and comprising at least one element selected from the group consisting of Pt, Pd, Ir, Al, Cu, AlCu, Au, Ag, Rh, Ti, Co, Ni, Fe, TiN, TaN, NiCr, TiW, WSi, TiSi, PtSi, PdSi, NiSi, and a second conductive layer having a direct contact with the free ferromagnetic layer and comprising at least one element selected from the group consisting of Hf, Ta, W, Nb, Mo, V, and Cr.

2. The memory cell of claim 1 wherein the pinned ferromagnetic layer comprising a synthetic antiferromagnetic.

3. The memory cell of claim 2 wherein the synthetic antiferromagnetic comprising:
   a first ferromagnetic layer;
   a second ferromagnetic layer, and
   a nonmagnetic spacer layer disposed between the first ferromagnetic layer and the second ferromagnetic layer and providing a substantial antiferromagnetic exchange coupling between the first and second ferromagnetic layers.

4. The memory cell of claim 3, further comprising an antiferromagnetic layer having a direct contact with a side of the first magnetic layer opposite to the nonmagnetic spacer layer.

5. The memory cell of claim 4 wherein the antiferromagnetic layer comprising a Mn-based alloy.

6. The memory cell of claim 1 wherein the first reversible magnetization direction and the second fixed magnetization direction are perpendicular to the substrate surface.

7. The memory cell of claim 1 wherein the first reversible magnetization direction and the second fixed magnetization direction are parallel to the substrate surface.

8. The memory cell of claim 1 wherein the bidirectional current switch is a back-to-back Schottky diode.

9. A nonvolatile memory cell comprising:
   a magnetoresistive element comprising a free ferromagnetic layer having a reversible magnetization direction, a pinned ferromagnetic layer having a fixed magnetization direction, and a tunnel barrier layer disposed between the free and pinned ferromagnetic layers;
   a bidirectional current switch coupled in series with the magnetoresistive element and comprising a first electrode, a second electrode, and a semiconductor layer disposed between the first and second electrodes,
   wherein the second electrode comprising a third conductive layer having a direct contact with the semiconductor layer and comprising at least one element selected from the group consisting of W, Ta, V, Cr, Ir, Al, Cu, AlCu, Au, Ag, Rh, Ti, Co, Ni, Fe, TiN, TaN, NiCr, TiW, WSi, TiSi, PtSi, PdSi, and NiSi, and a fourth conductive layer having a direct contact with the pinned ferromagnetic layer and comprising at least one element selected from the group consisting of Pt and Pd.

10. The memory cell of claim 9 wherein the pinned ferromagnetic layer comprising a synthetic antiferromagnetic.

11. The memory cell of claim 10 wherein the synthetic antiferromagnetic comprising:
   a first ferromagnetic layer;
   a second ferromagnetic layer, and
   a nonmagnetic spacer layer disposed between the first ferromagnetic layer and the second ferromagnetic layer and providing a substantial antiferromagnetic exchange coupling between the first and second ferromagnetic layers.

12. The memory cell of claim 9 wherein the bidirectional current switch is a back-to-back Schottky diode.

13. A nonvolatile memory cell comprising:
   a substrate having a surface;
   a magnetoresistive element comprising a free ferromagnetic layer having a first reversible magnetization direction, a pinned ferromagnetic layer having a second fixed magnetization direction, and a tunnel barrier layer disposed between the free and pinned ferromagnetic layers;
   a bidirectional current switch coupled in series with the magnetoresistive element and comprising a first electrode, a second electrode, and a semiconductor layer disposed between the first and second electrodes;
   a first conductor comprising a magnetic cladding and coupled to a first terminal adjacent to the magnetoresistive element; and
   a second conductor coupled to a second terminal adjacent to the bidirectional current switch,
   wherein the second electrode comprising a third conductive layer having a direct contact with the semiconductor layer and comprising at least one element selected from the group consisting of W, Ta, V, Cr, Ir, Al, Cu, AlCu, Au, Ag, Rh, Ti, Co, Ni, Fe, TiN, TaN, NiCr, TiW, WSi, TiSi, PtSi, PdSi, and NiSi, and a fourth conductive layer having a direct contact with the pinned ferromagnetic layer and comprising at least one element selected from the group consisting of Pt and Pd.

14. The memory cell of claim 13 wherein the pinned ferromagnetic layer comprising a synthetic antiferromagnetic.

15. The memory cell of claim 14 wherein the synthetic antiferromagnetic comprising:
   a first ferromagnetic layer;
   a second ferromagnetic layer, and
   a nonmagnetic spacer layer disposed between the first ferromagnetic layer and the second ferromagnetic layer and providing a substantial antiferromagnetic exchange coupling between the first and second ferromagnetic layers.

16. The memory cell of claim 15 wherein the bidirectional current switch is a back-to-back Schottky diode.

17. The memory cell of claim 13 wherein the magnetic cladding is disposed on a side of the first conductor opposite to the magnetoresistive element.

18. The memory cell of claim 13 wherein the first magnetization direction is reversed by a joint effect of a spin-polarized current running through the magnetoresistive element in a direction perpendicular to the substrate surface and a bias magnetic field produced by a bias current running through the first conductor.

* * * * *